United States Patent [19]

Inami et al.

[11] 4,307,340
[45] Dec. 22, 1981

[54] SPECTRUM DISPLAY APPARATUS

[75] Inventors: Mamoru Inami; Yoshiaki Tanaka, both of Yokohama, Japan

[73] Assignee: Victor Company of Japan, Ltd., Kanagawa, Japan

[21] Appl. No.: 78,389

[22] Filed: Sep. 24, 1979

[30] Foreign Application Priority Data

Sep. 26, 1978 [JP] Japan .................... 53-118441

[51] Int. Cl.³ .......................... G01R 23/16
[52] U.S. Cl. ................. 324/77 E; 324/121 R
[58] Field of Search ............. 324/77 A, 77 B, 77 C, 324/77 D, 77 E, 121 R

[56] References Cited

U.S. PATENT DOCUMENTS

| 3,581,192 | 5/1971 | Miura | 324/77 E |
| 4,085,352 | 4/1978 | Hilton | 324/121 R |
| 4,114,095 | 9/1978 | Pankove | 324/121 R |

Primary Examiner—Michael J. Tokar
Attorney, Agent, or Firm—Haseltine and Lake

[57] ABSTRACT

A spectrum display apparatus comprises a plurality of band-pass filters respectively having filtering bands of different center frequencies and operating to filter an input signal thereby to band-divide the input signal, a holding circuit normally passing the output signals of the band-pass filters and, upon the application thereto of a control signal, operating in response to the control signal to hold output signal voltages of the band-pass filters at the time of the control signal application, a display section having displaying elements of systems of the same number as the band-pass filters respectively corresponding to the band-pass filters, a circuit for supplying output signals of the holding circuit to the displaying elements and causing level displaying by the displaying elements of those systems corresponding respectively to the output signal levels of the band-pass filters, a control manipulation switch, and a circuit for producing the control signal and applying the same to the holding circuit during a specific time period after manipulation of the switch.

10 Claims, 9 Drawing Figures

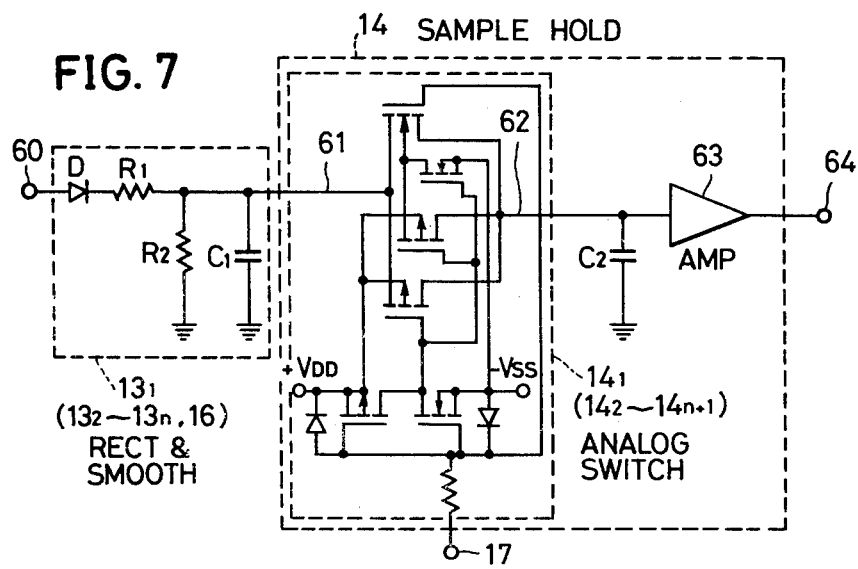
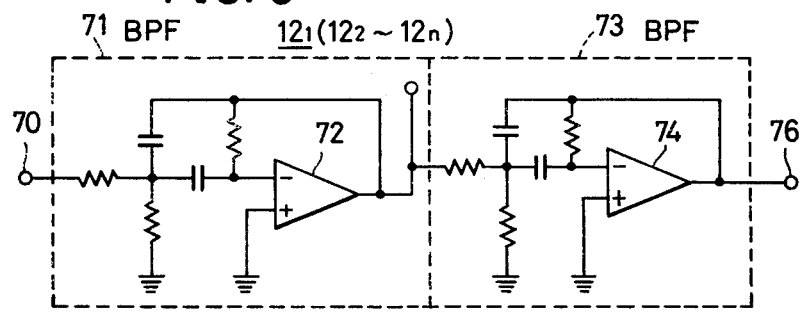
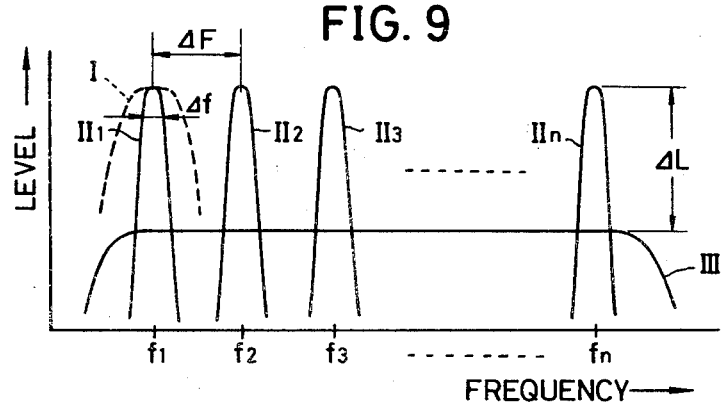

SPECTRUM DISPLAY APPARATUS

BACKGROUND OF THE INVENTION

The present invention relates generally to spectrum display apparatuses and more particularly to a spectrum display apparatus which is used to operate in cooperation with graphic equalizers for variably adjusting the signal level of each of a plurality of divided frequency bands, and in which, after the level display of the signals of all bands and the full band has once stopped, this level display is automatically restored.

In general, in the case where, in the recording of an audio signal, sounds which are unpleasant to the ear, such as a disturbing sound of low, constant frequency and the sound of the wind, are present, it is desirable in some instances to carry out the sound recording with the levels of the frequency bands in which these sounds exist in lowered state. In the reproducing apparatus, furthermore, in the case where the fidelity of the reproduced audio signal is impaired by the effects of characteristics such as the frequency characteristics possessed by the speakers, pickup cartridge, and other acoustical devices themselves and the transmission characteristic of the listening room, it is desirable in some instances to correct the levels of signals of certain frequency bands. In addition, there are instances wherein, for both recording and reproducing, the frequency characteristics are not made flat but are transformed into desired characteristics. In such cases, a graphic equalizer capable of variably adjusting signal level is used for each of the divided frequency bands.

In some graphic equalizers, a calibration scale for indicating the adjustment level is provided interrelatedly with the control knob for level adjustment of each band. With this arrangement, however, while the amount of level adjustment with respect to the input signal can be determined, the level of the signal after it has been level adjusted cannot be accurately determined.

Accordingly, a spectrum display apparatus for level display of each of the divided bands of the signal so as to make possible level adjustment as the spectrum of the signal after it has passed through the graphic equalizer is observed by means of a spectrum analyzer has been proposed. By the use of this apparatus, level adjustment can be accomplished quickly and accurately since it can be carried out while the actual level of the signal being level adjusted is observed.

However, since the level of the input signal varies from time to time, moment by moment, it is considerably difficult to accurately preceive the state of the level at a certain instant of time. Accordingly, in order to perceive the state of the level at any one instant of time, it is desirable that the display of the state of the level at that instant be stopped.

In a known spectrum display apparatus having a spectrum analyzer incorporated therein, the input signal is shifted by means of a shift register of 100 bits, for example, and this is digitally held and supplied to a display drive circuit thereby to carry out level displaying for each of the divided bands.

In this known apparatus, the stopping of the level display is accomplished by holding the shift register. For this reason, after the level display has been once stopped, this state of display is preserved. As a consequence, when normal displaying in accordance with the level variations occuring from time to time, moment by moment is resumed, it has been necessary to terminate the stopped state of the display by operating a switch each time. For this reason, the operation of the apparatus has been very troublesome. Furthermore, since a shift register is used in this known apparatus, in the case where the number of the display elements is increased in order to display the level state in an even finer manner, the number of bits of the shift register must be increased, and problems such as higher cost of production arise.

SUMMARY OF THE INVENTION

Accordingly, it is a general object of the present invention to provide a novel and useful spectrum display apparatus in which the above described difficulties encountered in the prior apparatus have been overcome.

Another and specific object of the invention is to provide a spectrum display apparatus which is capable of stopping and displaying the state of the level of each divided band with respect to the input signal at any time instant and, moreover, is capable of automatically terminating the stoppage of display after the display has been stopped for a specific time period and again resuming the display in accordance with the level variations. By the use of this apparatus of the invention, the operator can easily operate the graphic equalizers without the necessity of manipulating a switch for terminating the stopped state of the level display as in the known apparatus.

Still another object of the invention is to provide a spectrum display apparatus in which the level display automatically stops during a short period when the level of the input signal reaches a predetermined set level, and, thereafter, displaying in response to level variations is automatically resumed.

Other objects and further features of the invention will be apparent from the following detailed description when read in conjunction with the accompanying drawings.

BRIEF DESCRIPTION OF THE DRAWINGS

In the drawings:

FIG. 7 is a circuit diagram of specific examples in concrete form of a rectification and smoothing circuit and a sample holding circuit in the apparatus illustrated in FIG. 1;

FIG. 8 is a circuit diagram of one example of an improved filter circuit used as a filter in the apparatus shown in FIG. 1; and FIG. 9 is a graph indicating filtering characteristics of the filter circuit shown in FIG. 8.

DETAILED DESCRIPTION

Figure 1:
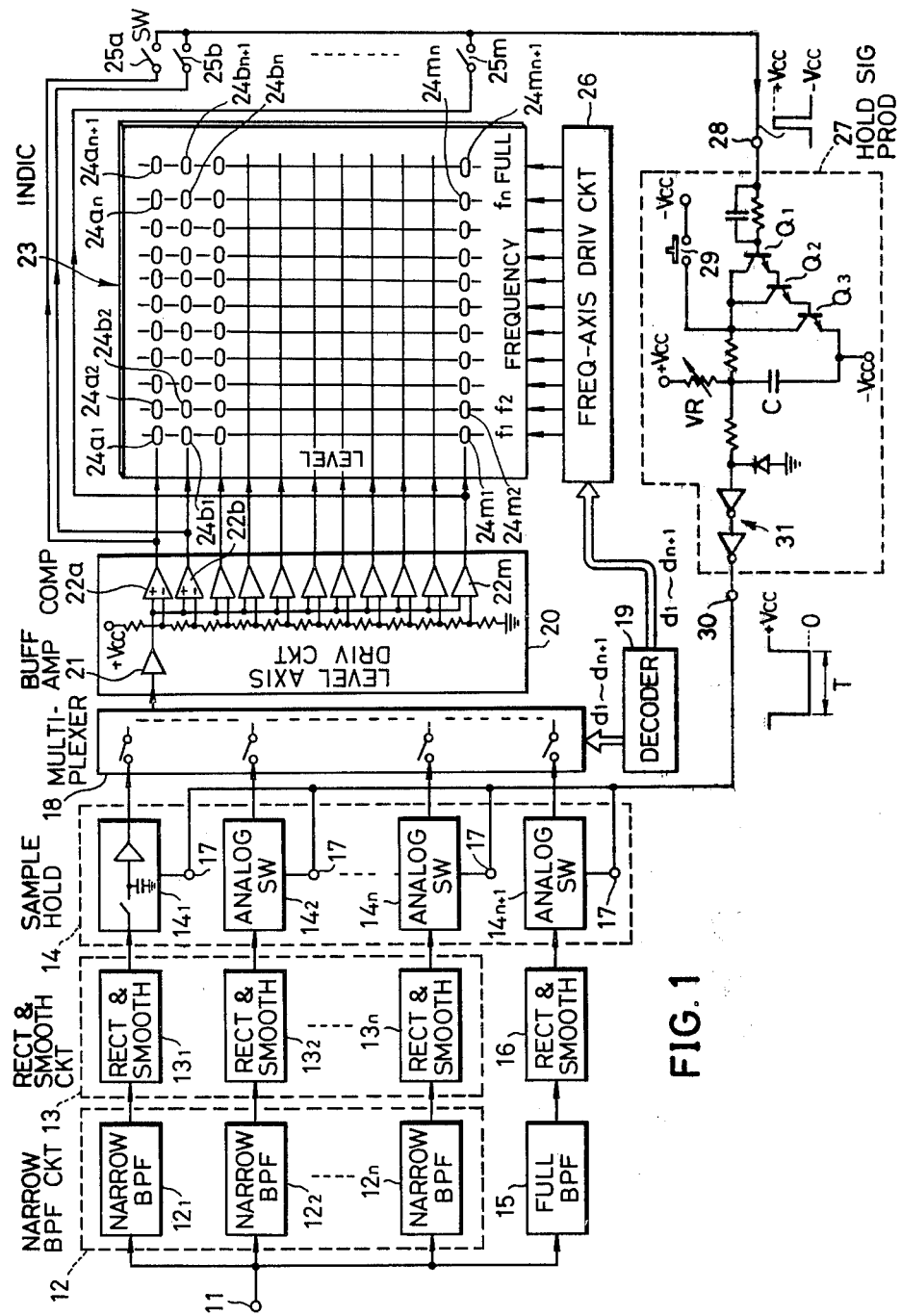
FIG. 1 is a block diagram of one embodiment of the spectrum display apparatus of the present invention.
Figure 2:
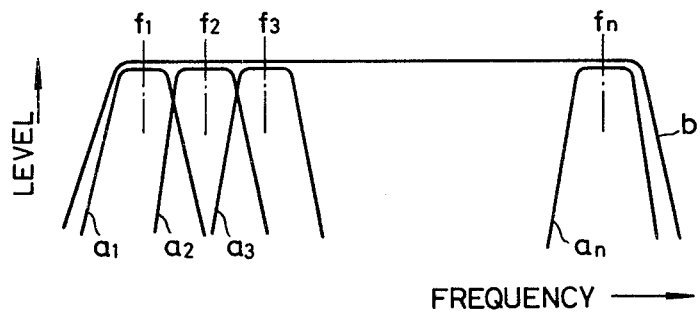
FIG. 2 is a graph indicating characteristics of a filter circuit in the apparatus illustrated in FIG. 1.

The block circuit system of one embodiment of the spectrum display apparatus according to the present invention will first be described in conjunction with FIG. 1. In this spectrum display apparatus 10, an audio signal introduced thereinto through an input terminal 11 is fed to a narrow band-pass filter circuit 12 comprising n narrow band-pass filters $12_1$ through $12_n$ and to a full band-pass filter 15. As indicated in FIG. 2, the narrow band-pass filters $12_1$ through $12_n$ respectively have narrow band-pass filtering characteristics a1 through an for filtering narrow bands respectively having different center frequencies f1 through fn. The full band-pass filter 15 has a full band-pass filtering characteristic b for filtering the entire band of the input audio signal.

The signal components which have been filtered and band divided by the filters $12_1$ through $12_n$ and the full band signal produced as output from the filter 15 are respectively supplied to a rectification and smoothing circuit 13 comprising rectifying and smoothing circuits $13_1$ through $13_n$ and to a rectifying and smoothing circuit 16, where they are rectified and smoothed. The resulting signal components are supplied to a sample holding circuit 14 comprising analog switch circuits $14_1$ through $14_n$. These signal components are supplied by way of the analog switch circuits $14_1$ through $14_n$, which are normally in an equivalently closed state, to a multiplexer 18.

Figure 3:
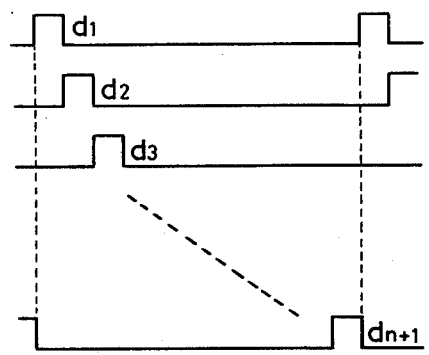
FIG. 3 is a graph showing the waveforms of output pulses of a decoder in the apparatus shown in FIG. 1.

This multiplexer 18 is supplied successively with decoded pulses d1 through dn+1 of (n+1) notation of timing waveforms as shown in FIG. 3 from a decoder 19 and successively and serially subjects the signal components from the analog switch circuits $14_1$ through $14_{n+1}$ to time division. The resulting signal thus time-divided is fed to a level axis (vertical axis) driving circuit 20. In this driving circuit 20, the time-divided signal is supplied through a buffer amplifier 21 to the input terminals on one side of comparators 22a through 22m connected in parallel. Reference voltages for comparison of respectively different magnitudes resulting from the division of a positive-voltage power source +Vcc by respective resistors are applied to the other input terminals of the comparators 22a through 22m. The output sides of the comparators 22a through 22m are respectively connected to level-displaying elements 24a1 through 24an+1, 24b1 through 24bn+1, . . . , 24m1 through 24mn+1 respectively in horizontal rows of a display section 23 and, at the same time, are respectively connected to setting switches 25a through 25m.

In the display section 23, the respective systems of the level-displaying elements 24a1 through 24m1, 24a2 through 24m2, . . . , 24an through 24mn are respectively arranged in vertical rows or columns so as to display respectively the signal levels of frequency bands a1, a2, . . . an respectively of center frequencies f1, f2, . . . fn. The level-displaying elements 24an+1 through 24mn+1 are vertically arranged so as to display the signal level of the full frequency band b.

The aforementioned decoder 19 supplies the same decoded pulses d1 through dn+1 as supplied to the multiplexer 18 to a frequency-axis (horizontal axis) driving circuit 26, which operates in response thereto to drive successively and time divisionally the level-displaying element groups 24a1 through 24m1, 24a2 through 24m2, . . . , 24an through 24mn, 24an+1 through 24mn+1 and to place the same in operable state.

Accordingly, under normal conditions, the band-passed signals which have been filtered by the narrow band-pass filters $12_1$ through $12_n$ and the full band-pass filter 15 are subjected to time division by the multiplexer 18 and successively supplied to the level axis driving circuit 20. Thereupon outputs corresponding to the levels of the signals higher than the comparison reference voltages are led out from the comparators. As a result, the level-displaying elements corresponding to the bands similarly time divided and driven become lit. Strictly speaking, a level-displaying element is extinguished by time division and driving. However, when the frequency of the decoder pulses has been selected at a value of the order of 100 Hz, the level-displaying element appears to be continuously lit because of the after-image or visual-persistence effect of the human eye. By the above described operation, the variations of the signal levels respectively of the bands a1 through an are displayed from time to time and moment by moment by the level-displaying element groups 24a1 through 24m1, . . . 24an through 24mn. Similarly, the variation of the level of the full band-passed signal is displayed by the level-displaying element group 24an+1 through 24mn+1.

The operation of the sample holding circuit 14 constituting an essential part of the apparatus of the present invention is controlled by a holding signal from a holding signal producing circuit 27. In this circuit 27, Darlington-connected transistors Q1, Q2, and Q3 constitute a switching transistor circuit. The base of the transistor Q1 is connected by way of a terminal 28 to the aforementioned setting switches 25a through 25m. The emitter of the transistor Q3 is connected to the negative-voltage power source −Vcc. One terminal of a manually-operated switch 29 of non-locking type is also connected to the nagative-voltage power source −Vcc. A variable resistor VR and a capacitor C are connected in series between the positive-voltage and negative-voltage sides +Vcc and −Vcc of the power source. The junction between the variable resistor VR and the capacitor C is connected by way of a resistor to the other terminal of the switch 29 and to the collectors of the transistors Q1, Q2, and Q3 and, at the same time, is connected by way of another resistor to an inverter circuit 31.

Normally, the capacitor C is being charged through the variable resistor VR by the power source voltage +Vcc. For this reason, a high-level signal is being produced as output at an output terminal 30 of the holding signal producing circuit 27. This output signal is applied through terminals 17 to the aforementioned analog switches $14_1$ through $14_n$ and thereby places these switches in their closed state.

Figure 4:
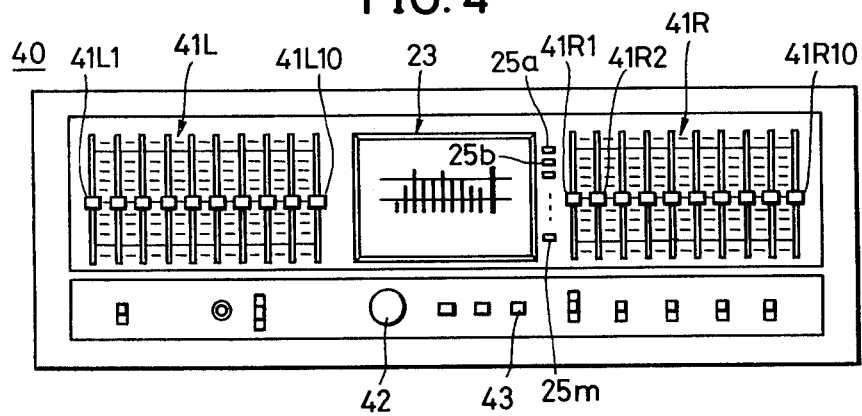
FIG. 4 is a front view of one example of a panel face of a spectrum display apparatus integrally combined with graphic equalizers.

The display apparatus of the invention as described above is integrally combined, for example, with graphic equalizers and has, for example, a front face panel 40 as illustrated in FIG. 4. This panel 40 is provided at its center with the aforedescribed display section 23. On the right and left sides of this display section 23, two groups of control knobs 41R and 41L for level adjustment of the graphic equalizers of the right and left channels are provided. Each of the control knobs 41R and 41L is adapted to be moved up and down for adjustment.

Figure 5:
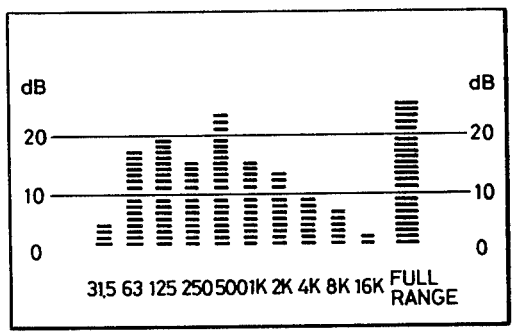
FIG. 5 is an enlarged front view of the display area of the panel face shown in FIG. 4.

In the case where the number of the narrow band-pass filters $12_1$ through $12_n$ is ten, for example, and are constituted by octave band-pass filters, the center frequencies f1 through fn(10) of the divided bands are, respectively, 31.5 Hz, 63 Hz, 125 Hz, 250 Hz, 500 Hz, 1 KHz, 2 KHz, 4 KHz, 8 KHz, and 16 KHz. The corresponding knobs 41R1 through 41R10 and 41L1 through 41L10 are adapted to adjust the levels of the signals of the divided bands of the above mentioned center frequencies f1 through f10, respectively. In the display section 23, displaying elements corresponding to the signal level of each divided band are lit thereby to display signal levels as bar-graphs as shown in FIG. 5.

The operational control in the case wherein specific desired sounds such as, for example, the sounds made by insects, are to be recorded with very little surrounding noise and, moreover, at an appropriate level through the use of the display apparatus of the invention will now be described.

Figure 6:
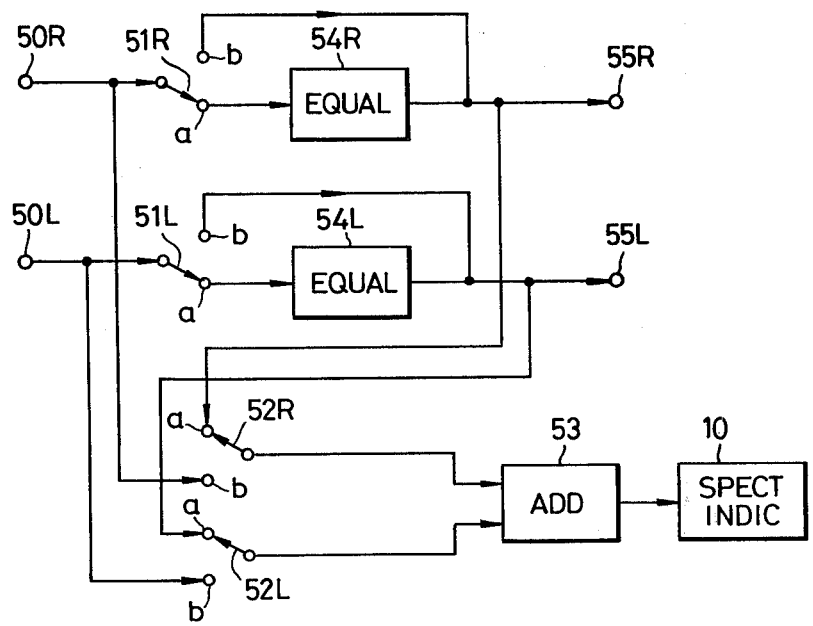
FIG. 6 is a block diagram of one example of connection between the spectrum display apparatus of the invention and graphic equalizers.

First, the signal obtained by picking up the sounds by means of a microphone (not shown) is applied through input terminals 50R and 50L shown in FIG. 6 to switches 51R, 51L, 52R, and 52L. The movable contact of each of these switches is connected to tis contact point a as shown in FIG. 6. Accordingly, the input signal passes by way of the switches 51R and 51L through graphic equalizers 54R and 54L having the aforementioned control knobs 41R and 41L. The outpus of these graphic equalizers 54R and 54L then pass through the switches 52R and 52L and are added in an adder 53. The resulting output of the adder 53 is fed to the input terminal 11 of the spectrum display apparatus 10, whereupon the levels of the signals of the divided bands and full band-passed signal level are displayed at the display section 23.

Then, as the display section 23 is watched, it will be observed that only the level of a certain frequency band varies greatly every time an insect emits and stops emitting a sound. From this, the approximate frequency band of the insect sound can then be estimated. Accordingly, a knob is first turned to set the resistance of the variable resistor VR at a high value. Then a switch button 43 is pushed to close the switch 29. Since this switch 29 is of the non-locking type, it is opened when the button 43 is released. As a consequence of the closing of this switch 29, the capacitor C is instantaneously discharged, and the level of the output signal at the terminal 30 becomes low. After the switch 29 is closed, the capacitor C is charged in accordance with the time constant determined by the capacitor C and the variable resistor VR. Then, as the capacitor is thus charged, the terminal voltage thereof reaches the threshold voltage (for example, $\frac{1}{2}$ Vcc) of the inverter circuit 31, the level of the output voltage of the terminal 30 becomes high.

When the level of the control signal applied through the terminal 30 to the terminals 17 of the sample holding circuit 14 becomes low, the analog switches $14_1$ through $14_{n+1}$ are equivalently opened in this low-level period of the control signal and supply the voltages held at that instant to the multiplexer 18. Thus, the signal levels respectively of the divided bands and the full band which are held at the instant when the switch 29 is closed are displayed in the display section 23.

In this manner, the level displaying of the display section 23 once stops at the instant when the switch button 43 is pushed. For this reason, by the above described control manipulation, it is possible to positively perceive the states of the signal level of the band of the sound to be recorded, such as insect sounds, the signal level of the band of other surrounding noise, and the signal level of the full band.

After the switch button 43 is released, the level of the signal applied to the terminals 17 becomes high with the above mentioned time constant, and the analog switches $14_1$ through $14_{n+1}$ are again closed. As a consequence, the display section 23 again resumes automatic displaying of level variations from time to time, moment by moment of the signals respectively of the divided bands and the full band. By appropriately setting the resistance value of the variable resistor VR, the holding time of the sample holding circuit 14 can be set at any value, and the time during which level displaying is stopped can be set as desired.

On the basis of this perception of the time at which the above mentioned level displaying has stopped, the operator manipulates the control knobs 41R and 41L of the graphic equalizers 54R and 54L so as to raise the level of signals of the band of the insect sounds, for example, and to lower the level of signals of the band of the surrounding noise.

Depending on the necessity, the above described operational cycle of closing the switch 29, stopping the level displaying, perceiving the levels, and adjusting the levels is repeated two or three times. By this procedure, the level of the signal of the desired band is raised, while the level of the signal of the band of the surrounding noise is lowered. As a result, the signal of the desired band is placed in a state wherein it can be recorded with a high level with little surrounding noise. Thus, the coarse adjustment is completed.

In a tape recorder, in general, there is a maximum level which is the limit within which satisfactory sound recording without distortion can be carried out. For this reason, it is necessary to prevent the level of the desired signal to be recorded from exceeding this maximum level.

Accordingly, the knob 42 is turned to reduce the resistance value of the variable resistance VR. In addition, with consideration of the maximum recording level of the tape recorder to be used for recording the desired signal, a level which the desired audio signal to be recorded must not exceed is determined. Then that switch, of the switches 25a through 25m, which corresponds to this level, for example, the switch 25b, is closed and left in that closed state.

Then, when the level of the audio signal being recorded (full band signal) reaches the above mentioned determined level, an output is produced from the comparator 22b, and the level-displaying element connected thereto is lit. At the same time, this output signal passes through the switch 25b, which is in closed state, and is supplied through the terminal 28 to the holding signal generating circuit 27. As a consequence, the transistors Q1, Q2, and Q3 become "ON", and the capacitor C is instantaneously discharged.

Similarly as described hereinabove, the level of the output voltage at the terminal 30 becomes low. The sample holding circuit 14 supplies a holding voltage to the multiplexer 18, whereupon, the level displaying of the display section 23 stops. Then, since the variable resistor VR has been set at a low resistance value, the recharging time of the capacitor C is short, and the display section 23 is restored in a short time from its state of stoppage of level displaying to its normal state of displaying the level variations.

Thus, when the signal level reaches a preset specific level, the level displaying stops for a short time. For this reason, the operator, while watching the display section 23, notices that the level displaying has stopped for a short time and is thereby able to easily determine the fact that the signal level has reached the above mentioned specific level. The operator then manipulates control knobs of the graphic equalizers to lower slightly the level. Thus, fine level adjustment is completed.

In this fine adjustment, it is not necessary to carry out manipulations for fine level adjustment for each band as in the aforedescribed coarse adjustment. For this reason, the stoppage time of the level displaying may be short. Accordingly, it is desirable to set the resistance of the variable resistor VR at a low value thereby to restore the operation to the displaying of level variation immediately after the stopping of the level displaying.

As a result of the above described level adjustment control, signals, in which the level of the band of surrounding noise has been lowered and the signal level of the band of the desired sound to be recorded has been adjusted to an appropriate sound recording level, are obtained at output terminals 55R and 55L of the circuit shown in FIG. 6 and are fed to a tape recorder (not shown), where they are recorded in an appropriate state on a magnetic tape.

Next, specific examples of circuits in concrete form of essential parts of the block system shown in FIG. 1 will be described. Specific examples of the rectification and smoothing circuit 13 and the sample holding circuit 14 are shown in FIG. 7. In FIG. 7, only a rectifying and smoothing circuit $13_1$ and an analog switch $14_1$ are shown, and the other rectifying and smoothing circuits $13_2$ through $13_n$ and 16 and the other analog switches $14_2$ through $14_{n+1}$ are omitted since they are of the same circuit organization.

A signal from the narrow band-pass filter $12_1$ is applied to an input terminal 60 of the rectifying and smoothing circuit $13_1$ shown in FIG. 7, which comprises a rectifying diode D, resistors R1 and R2, and a capacitor C1. The signal is thereby subjected to half-wave rectification and smoothing. The rising time and the falling time of the signal are determined by the resistors R1 and R2. In this case, this rectifying and smoothing circuit may be constituted as a full-wave rectifier circuit. Furthermore, this unit may have a circuit organization in which an operational amplifier is used instead of the rectifying diode D, and which carries out ideal diode action.

The output signal of the rectifying and smoothing circuit $13_1$ is fed to the analog switch $14_1$ within the sample holding circuit 14. The analog switch $14_1$ is operated by the control voltage applied to its terminal 17 from the terminal 30 of the holding signal generating circuit 27 to carry out "ON-OFF" switching operation between its input line 61 and its output line 62.

Normally, the analog switch $14_1$ is in its "ON" or closed state, whereby the signal flowing through the input line 61 passes through the output line 62 and is supplied to an amplifier 63 of an amplification degree of 1 (unity) and high input impedance. A capacitor C2 is connected between the input side of this amplifier 63 and ground (earth). The output signal of the amplifier 63 is supplied through an output terminal 64 to the multiplexer 18.

Then, when the level of the control signal applied from the holding signal producing circuit 27 to the terminal 17 of the analog switch $14_1$ changes as mentioned above, the analog switch $14_1$ assumes its "OFF" or opened state, and the voltage held in the capacitor C2 at the time is led out through the output terminal 64.

In the circuit of the above described embodiment of the invention, the capacitor C1 in the rectifying and smoothing circuit $13_1$ may be omitted. In this case, the capacitor C2 is used doubly for smoothing and for holding. More specifically, when the analog switch $14_1$ is in its "ON" or closed state, the capacitor C2 operates as a smoothing element, and when the analog switch $14_1$ is in its "OFF" or opened state, the capacitor C2 operates as a holding element.

One specific example in concrete form of one narrow band-pass filter $12_1$ taken as representing the narrow band-pass filters $12_1$ through $12_n$ consitituting an embodiment of the invention will now be described with reference to FIG. 8. When band-pass filters of conventional type are used for the narrow band-pass filters, the filtering characteristics of these filters are respectively as indicated by curves a1 through an in FIG. 2. It will be observed that adjacent characteristics mutually overlap at their skirt parts. For this reason, the levels of the signals of these overlapped portions are displayed in superimposed state at the level display section 23. Consequently, an accurate and positive level displaying of divided bands cannot be achieved. Accordingly, filtering characteristics of very narrow filtering pass bands which do not mutually overlap are required. This requirement is fulfilled by the narrow band-pass filters according to the invention, one of which is shown in FIG. 8.

This narrow band-pass filter $12_1$ comprises two band-pass filters 71 and 73 in cascade connection. Each of these band-pass filters 71 and 73 has the same circuit organization and the same filtering characteristic as a conventional band-pass filter, and both filters have the same center frequency f1. These band-pass filters 71 and 73 are constituted by active band-pass filters of multiple-feedback type in which operational amplifiers 72 and 74 are employed. A signal passing through the band-pass filter 71 becomes a signal of a characteristic as indicated by broken-line curve I in FIG. 9. This output signal, upon passing through the band-pass filter 73, becomes a divided band signal of a characteristic as indicated by full-line curve $II_1$ in FIG. 9. The band width $\Delta f$ of the narrow band signal of the characteristic $II_1$ is amply narrower than the spacing interval $\Delta F$ between the center frequencies of the mutually adjacent band-pass filters. It is desirable that ratio $fk/\Delta f$, where fk (f1 through fn) is the center frequency of the filter pass band, be selected at a value of the order of 8.

The filtering characteristic of the full band-pass filter 15 is indicated by full-line curve III in FIG. 9. As is apparent from FIG. 9, this filtering characteristic has a band which covers all divided bands and, moreover, has a response level which is reduced by $\Delta L$ relative to the maximum levels of the filtering characteristics $II_1$ through $II_n$ of the narrow band-pass filters $12_1$ through $12_n$. The purpose of this is to cause the energy integrated value in the pass band of the full band-pass filter 15 to become substantially equal to the energy integrated value in the pass bands of the narrow band-pass filters and to prevent the displaying of the display section 23 from overshooting the scales. This can be accomplished by connecting an attenuator to the full band-pass filter. By this provision, an undesirable mode of level displaying wherein the full band signal level display always reaches full scale before the level displays of the divided band signals reach full scale, whereby the level displaying of the divided band signals always cannot be carried out except within a low level range, is prevented.

Further, this invention is not limited to these embodiments but various variations and modifications may be made without departing from the scope of the invention.

What we claim is:

1. A spectrum display apparatus comprising:
   a plurality of band-pass filters respectively having filtering bands of different center frequencies and operating to filter an input signal thereby to band-divide the input signal;
   holding means normally passing the output signals of the band-pass filters and holding output signal voltages of the band-pass filters when a control signal is applied to said holding means;
   a display section having displaying means of systems of the same number as the band-pass filters respectively corresponding to the band-pass filters;
   means for supplying output signals of the holding means to the displaying means for displaying signals corresponding respectively to the output signal levels of said band-pass filters;
   means for producing the control signal and apply the same to the holding means during a specific time period after manipulation of the switch;
   a manually-operated control switch in said means for producing the control signal, said control signal being applied to said holding means after operation of said control switch.

2. A spectrum display apparatus as claimed in claim 1 in which the holding means comprises analog switches which are normally in the "ON" or closed state and assume the "OFF" or opened state when the control signal is applied thereto and capacitors for voltage holding connected to the output sides of the analog switches.

3. A spectrum display apparatus as claimed in claim 2 further comprising a rectifying and smoothing circuit for rectifying and smoothing output signals of the band-pass filters and supplying the resulting output signals to the analog switches.

4. A spectrum display apparatus comprising:
   a plurality of band-pass filters respectively having filtering bands of different center frequencies and operating to filter an input signal thereby to band-divide the input signal;
   holding means normally passing the output signals of the band-pass filters and holding output signal voltages of the band-pass filters when a control signal is applied to said holding means;
   a display section having displaying means of systems of the same number as the band-pass filters respectively corresponding to the band-pass filters;
   means for supplying output signals of the holding means to the displaying means for displaying signals corresponding respectively to the output signal levels of said band-pass filters;
   means for producing the control signal and apply the same to the holding means during a specific time period after manipulation of the switch;
   a manually-operated control switch in said means for producing the control signal, said control signal being applied to said holding means after operation of said control switch;
   said means for producing the control signal being connected to the control manipulation switch and comprising a capacitor which is charged while d the control switch is open and is instantaneously discharged by the closure of the control switch, and which is recharged by a subsequent opening of the control switch, a resistor determining the charging time constant of the capacitor, and a circuit for producing as output the control signal during the period from the time of discharge of the capacitor to the time when the charged voltage of the capacitor reaches a specific threshold value.

5. A spectrum display apparatus as claimed in claim 4 in which the circuit for producing as output the control signal comprises an inverter circuit.

6. A spectrum display apparatus as claimed in claim 4 which further comprises means connected to the means for causing level displaying and operating to pass signals when the output signal levels of the holding means reach preset levels, and in which the means for producing the control signal further has a switching circuit which, when the signal thus passed is applied thereto, assumes the "ON" or closed state and causes the capacitor to be instantaneously discharged.

7. A spectrum display apparatus as claimed in claim 1 further comprising a full band-pass filter for filtering substantially the entire band of the input signal, means for normally passing the output signal of the full band-pass filter and operating in response to the control signal applied thereto to hold the output signal voltage of the full band-pass filter at the time when the control signal is thus applied thereto, and displaying means disposed in alinement with the displaying means of the systems provided in correspondence with the band-pass filters and operating upon being supplied with the output signals of the holding means to display the level of the full band signal.

8. A spectrum display apparatus as claimed in claim 1 in which each band-pass filter comprises a plurality of cascade-connected band-pass filters having the same center frequency.

9. A spectrum display apparatus as claimed in claim 7 in which the maximum response level of the filtering characteristic of the full band-pass filter is set at a level which is lower by a specific quantity than the maximum response level of the filtering characteristics of the plurality of band-pass filters.

10. A spectrum display apparatus comprising;
    a plurality of band-pass filters respectively having filtering bands of different center frequencies and operating to filter an input signal thereby to band-divide the input signal;
    holding means normally passing the output signals of the band-pass filters and holding output signal voltages of the band-pass filters when a control signal is applied to said holding means;
    a display section having displaying means of systems of the same number as the band-pass filters respectively corresponding to the band-pass filters;
    means for supplying output signals of the holding means to the displaying means for displaying signals corresponding respectively to the output signal levels of said band-pass filters;
    means for producing the control signal and applying the same to the holding means during a specific time period after manipulation of the switch;
    a manually-operated control switch in said means for producing the control signal, said control signal being applied to said holding means after operation of said control switch;

said holding means comprising analog switches which are normally in the "ON" or closed state and assume the "OFF" or opened state when the control signal is applied thereto and capacitors for voltage holding connected to the output sides of the analog switches;

rectifying circuits for rectifying output signals of the band-pass filters and supplying the signals thus rectified to the analog switches, and in which the capacitors of the holding means operate to smooth the outputs of the rectifying circuits which have passed through the analog switches when the analog switches are in the "ON" or closed state and, when the analog switches are in the "OFF" or opened state, to hold the output voltages of the rectifying circuits immediately prior to the instants at which the analog switches assume the "OFF" state.

* * * * *